United States Patent
Kim et al.

(10) Patent No.: US 7,177,381 B2
(45) Date of Patent: Feb. 13, 2007

(54) NOISE-RESISTIVE, BURST-MODE RECEIVING APPARATUS AND A METHOD FOR RECOVERING A CLOCK SIGNAL AND DATA THEREFROM

(75) Inventors: Yu-kun Kim, Seoul (KR); Seung-woo Lee, Seoul (KR); Woo-young Choi, Seoul (KR); Nam-guk Kim, Seoul (KR); Hyun-surk Ryu, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 770 days.

(21) Appl. No.: 10/179,400

(22) Filed: Jun. 26, 2002

(65) Prior Publication Data

US 2003/0026373 A1 Feb. 6, 2003

(30) Foreign Application Priority Data

Jun. 27, 2001 (KR) .............................. 2001-37050

(51) Int. Cl.
*H03D 3/24* (2006.01)
(52) U.S. Cl. .................. 375/376; 375/354; 375/371; 375/373; 455/260; 324/76.53; 327/147; 327/156; 713/327
(58) Field of Classification Search ............. 375/373, 375/376, 276, 374; 370/395.62; 398/155
See application file for complete search history.

(56) References Cited

U.S. PATENT DOCUMENTS

| | | | | |
|---|---|---|---|---|
| 4,513,427 A | | 4/1985 | Borriello et al. ............ 375/110 |
| 5,319,266 A | * | 6/1994 | Chu et al. .................... 327/91 |
| 5,399,995 A | * | 3/1995 | Kardontchik et al. ......... 331/17 |
| 5,432,827 A | | 7/1995 | Mader ........................ 375/576 |
| 6,236,697 B1 | * | 5/2001 | Fang .......................... 375/376 |

* cited by examiner

*Primary Examiner*—Mohammed Ghayour
*Assistant Examiner*—Adolf DSouza
(74) *Attorney, Agent, or Firm*—Lee & Morse, P.C.

(57) ABSTRACT

A noise-resistive, burst-mode receiving apparatus including a voltage control signal generator for multiplying a frequency of a system clock signal and generating a voltage control signal having a level that corresponds to the multiplied frequency; a reset signal generator for delaying an irregular input signal in the unit of a packet, in response to the voltage control signal, performing an exclusive OR operation on the delayed and input signals, and outputting the result as a reset signal; a clock signal generator for generating a signal having a level that is changed at the middle point of each bit included in the packet as a recovered clock signal in response to the reset signal and the voltage control signal and outputting the recovered clock signal; and an output buffer for buffering the input signal and outputting the buffered signal as recovered data in response to the recovered clock signal.

20 Claims, 7 Drawing Sheets

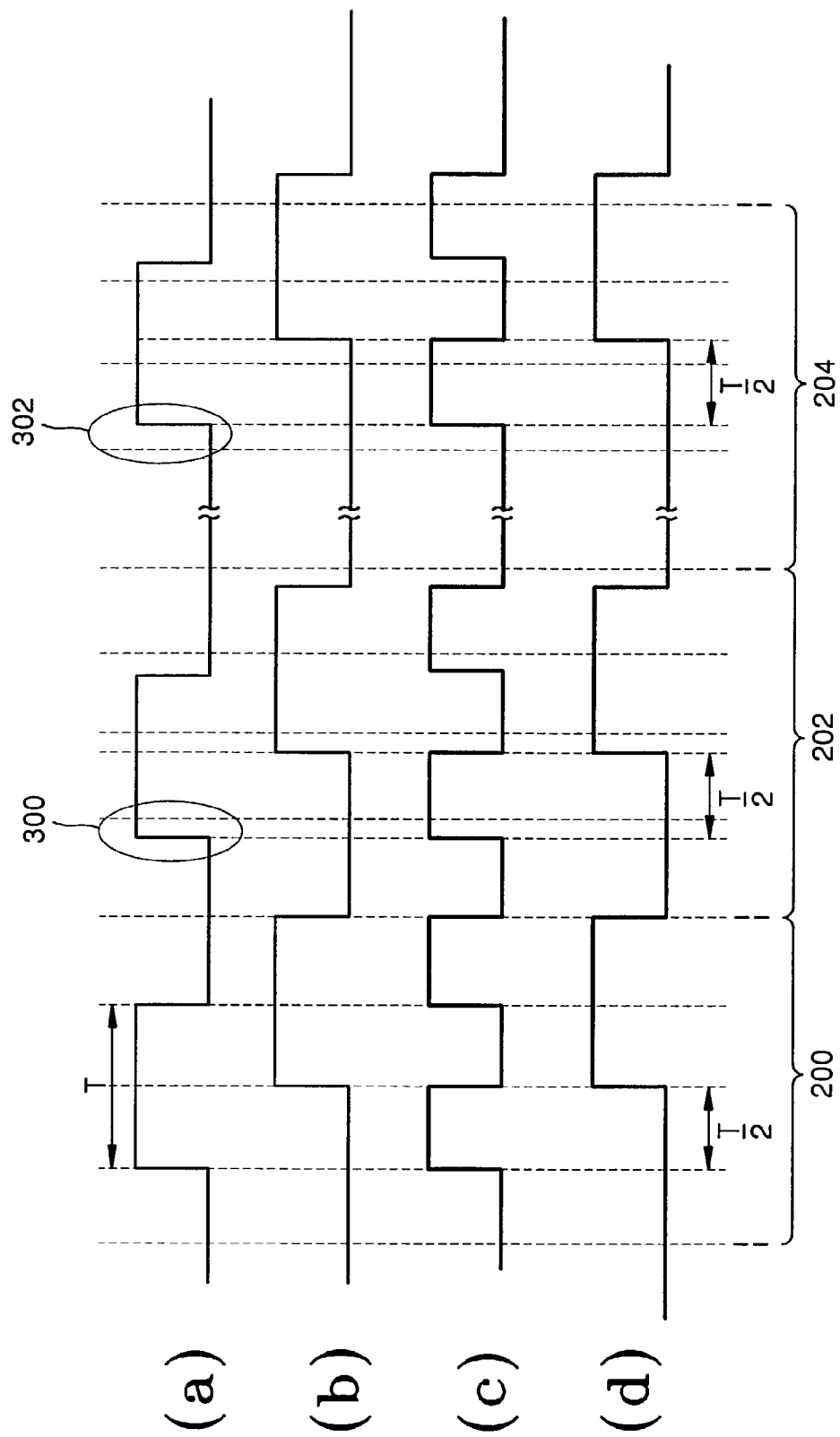

NOISE-RESISTIVE, BURST-MODE RECEIVING APPARATUS AND A METHOD FOR RECOVERING A CLOCK SIGNAL AND DATA THEREFROM

BACKGROUND OF THE INVENTION

1. Field of the Invention

The present invention relates to a burst-mode receiving apparatus. More particularly, the present invention relates to a noise-resistive, burst-mode receiving apparatus and a method for recovering a clock signal and data therefrom.

2. Description of the Related Art

In general, a receiving apparatus of a communication system adopts a phase locked loop (PLL) to recover a clock signal and data therein. The PLL is capable of minimizing the swaying of an edge of an input signal caused by a vibration or outer shocks, and thus, it is possible to recover a clock signal having the optimal decision timing in the receiving apparatus.

However, unlike the receiving apparatus adopted in general communication systems, it is difficult to recover a clock signal and data with a conventional burst-mode receiving apparatus using the PLL. This difficulty arises because the frequency of the input signal input into the receiving apparatus is different from the frequency of a system clock signal that is used in the burst-mode receiving apparatus. Further, since the specific time when the input signal is to be input is difficult to determine, intervals between burst cells are bits that cannot be continuously calculated, irrespective of the system clock signal. For this reason, the conventional burst-mode receiving apparatus adopting a PLL can be used without any particular inconvenience in a case where the input signal is changed slightly within a tracking range after the PLL is locked. However, if the PLL becomes unlocked due to a large difference between the phase of an interval between the present cell and the next cell and the phase of a clock signal recovered at the present cell, acquisition time is required until the unlocked PLL becomes locked again. Accordingly, the PLL is not available in the conventional burst-mode receiving apparatus that is designed to speedily recover a clock signal.

Meanwhile, in a conventional burst-mode receiving apparatus that is capable of recovering a clock signal and the data thereof without a PLL, an input signal and a clock signal are controlled to be in phase by delaying the input signal, generating the clock signal at the beginning of inputting data, or selecting either a clock signal that leads an input signal or that is in phase with the input signal among multi-phase clock signals. Of these methods, the method of selecting a desired clock signal among the multi-phase clock signals is mainly used. At this time, since the receiving rate of an input signal is difficult to determine, the conventional burst-mode receiving apparatus uses a self-generated system clock signal. Thus, in the event that the input signal is successively input with 0 or 1, there is a higher probability that the number of successive bits is erroneously recognized, and a time delay of at least 3 bits may elapse before the clock signal is recovered.

SUMMARY OF THE INVENTION

In an effort to solve the above problems, it is a first feature of an embodiment of the present invention to provide a noise-resistive, burst-mode receiving apparatus capable of quickly recovering a clock signal and data while minimizing damage due to noise.

It is a second feature of an embodiment of the present invention to provide a method for recovering a clock signal and data performed by a burst-mode receiving apparatus according to an embodiment of the present invention.

To provide the first feature, there is provided noise-resistive, burst-mode receiving apparatus including a voltage control signal generator for multiplying a frequency of a system clock signal and for generating a voltage control signal having a level that corresponds to the multiplied frequency of the system clock signal; a reset signal generator for delaying an input signal which is irregularly input in the unit of a packet in response to the voltage control signal, for performing an exclusive OR operation on the delayed signal and the input signal, and for outputting the result of the exclusive OR operation as a reset signal; a clock signal generator for generating a signal having a level that is changed at the middle point of each bit included in the packet as a recovered clock signal in response to the reset signal and the voltage control signal and for outputting the recovered clock signal; and an output buffer for buffering the input signal and for outputting the buffered signal as recovered data in response to the recovered clock signal.

To provide the second feature, there is provided a method for recovering a clock signal and data, performed by a noise-resistive, burst-mode receiving apparatus, the method including multiplying a frequency of a system clock signal and then generating a voltage control signal having a level that corresponds to the multiplied frequency; delaying an input signal, which is irregularly given in the unit of a packet, using the voltage control signal, and then performing an exclusive OR operation on the delayed signal and the input signal to obtain a reset signal; generating a signal having a level that is changed at the middle point of each bit included in the packet, as a recovered clock signal, using the reset signal and the voltage control signal; and buffering the input signal and obtaining data recovered from the buffered signal, using the recovered clock signal.

BRIEF DESCRIPTION OF THE DRAWINGS

The above and other features and advantages of the present invention will become more apparent upon review of a detailed description of preferred embodiments thereof with reference to the attached drawings in which:

7, assuming that the middle point T' of each bit included in the packet of an input signal is T/2; and FIGS. 9(a) through (d) are waveform diagrams of each element of the reset signal generator of FIG. 5 and a recovered clock signal.

DETAILED DESCRIPTION OF THE INVENTION

Korean Patent Application No. 2001-37050, filed on Jun. 27, 2001, and entitled: "Noise-Resistive, Burst-Mode Receiving Apparatus and Method for Recovering Clock Signal and Data Therefrom," is incorporated by reference herein in its entirety.

Hereinafter, the structure and operations of a noise-resistive, burst-mode receiving apparatus according to the present invention and a method for recovering a clock signal and data will be described with reference to the accompanying drawings.

Figure 1:
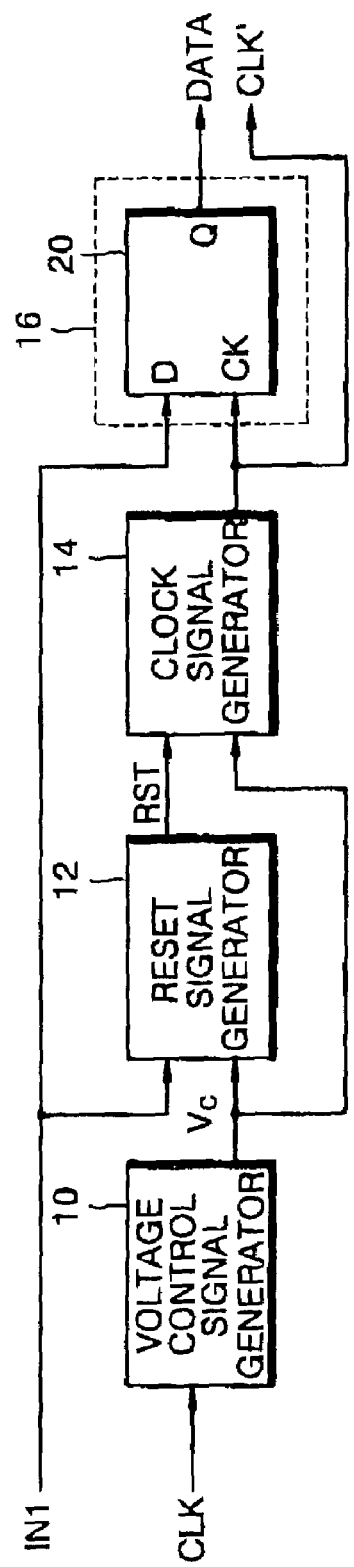
FIG. 1 illustrates a block diagram of a burst-mode receiving apparatus according to the present invention.

FIG. 1 illustrates a block diagram of a burst-mode receiving apparatus according to the present invention. The burst-mode receiving apparatus includes a voltage control signal generator 10, a reset signal generator 12, a clock signal generator 14, and an output buffer 16.

Figure 2:
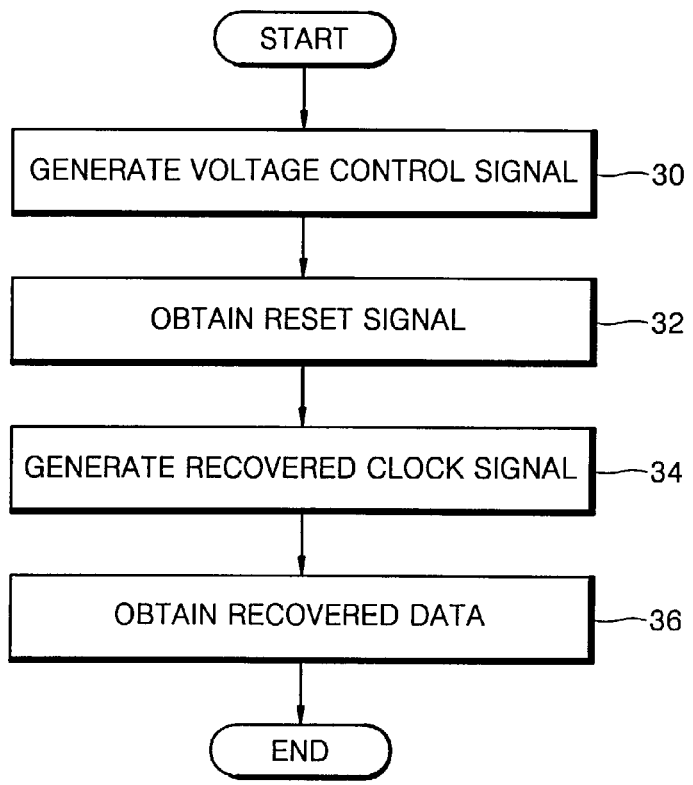
FIG. 2 is a flow chart for explaining a method of recovering a clock signal and data, performed by the burst-mode receiving apparatus according to an embodiment of the present invention.

FIG. 2 is a flow chart for explaining a method for recovering a clock signal and data, according to an embodiment of the present invention, performed by the burst-mode receiving apparatus of FIG. 1. In the method, a voltage control signal is generated in step 30. Next, a reset signal is obtained in step 32. Then, a recovered clock signal is generated in step 34. Thereafter, the recovered data is obtained in step 36.

More specifically, in step 30, the voltage control signal generator 10 multiplies the frequency of a system clock signal CLK input from the outside, generates a voltage control signal Vc, having a level that corresponds to the multiplied frequency of the system clock signal CLK, and outputs the generated voltage control signal Vc to the reset signal generator 12 and the clock signal generator 14. Here, the system clock signal CLK may have a frequency of 155 MHz, for example, and be generated in a burst-mode receiving apparatus according to the present invention or be transmitted from a device that transmits an optical signal, e.g., terminal equipment (not shown).

Next, the structure and operations of the voltage control signal generator 10, according to a preferred embodiment of the present invention, which performs step 30, will now be described with reference to FIG. 3.

Figure 3:
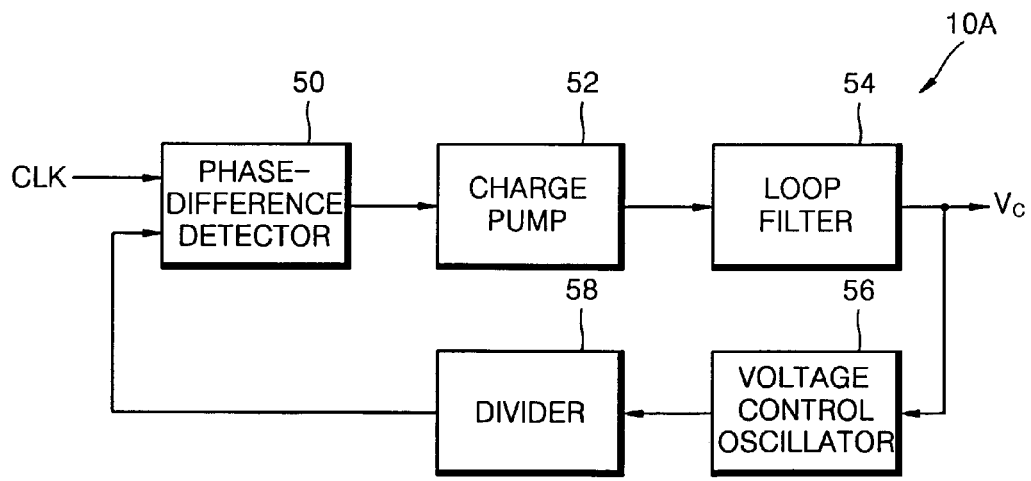
FIG. 3 illustrates a block diagram of a voltage control signal generator of FIG. 1 according to a preferred embodiment of the present invention.

FIG. 3 is a block diagram of a preferred embodiment 10A of a voltage control signal generator 10 of the present invention. The voltage control signal generator 10A includes a phase-difference detector 50, a charge pump 52, a loop filter 54, a voltage control oscillator 56 and a divider 58.

The phase-difference detector 50 detects a difference between a phase of a system clock signal CLK input from the outside and a phase of a dividing signal output from the divider 58 and then outputs the detected phase difference to the charge pump 52. Then, the charge pump 52 supplies or sinks an electric charge corresponding to the phase difference detected by the phase-difference detector 50. Next, the loop filter 54 low-pass filters voltage corresponding to the electric charge supplied or sunk by the charge pump 52 and then outputs the low-pass filtered voltage as a voltage control signal Vc to the voltage control oscillator 56, the reset signal generator 12, and the clock signal generator 14. Then, the voltage control oscillator 56 oscillates in response to the voltage control signal Vc generated by the loop filter 54 and outputs an oscillating signal having an oscillating frequency to the divider 58. Thereafter, the divider 58 divides the oscillating signal generated by the voltage control oscillator 56 and outputs the result of the division as a divided signal to the phase-difference detector 50. At this time, the level of the voltage control signal Vc is changed as much as the oscillating signal is divided by the divider 58. In other words, the more times the voltage control signal generator 10A of FIG. 3 multiplies the system clock signal CLK, the greater the increase in the level of the voltage control signal Vc, which is generated by the loop filter 54. At this time, the frequency of the system clock signal CLK, which is applied from the outside, may have various values, and the voltage control signal generator 10A of FIG. 3 can multiply the frequency of the system clock signal CLK by the divider 58 even if the frequency of the system clock signal CLK is lower.

After step 30, in step 32, the reset signal generator 12 delays an input signal, which is irregularly input from an input terminal IN1 in the unit of a packet, in response to the voltage control signal Vc generated by the voltage control signal generator 10, performs an exclusive OR operation on the delayed signal and the input signal input from the input terminal IN1, and outputs the result of the exclusive OR operation as a reset signal RST to the clock signal generator 14.

The structure and operations of the burst-mode receiving apparatus of FIG. 1 that generates the input signal to be input to the reset signal generator 12 will now be described with reference to FIG. 4.

Figure 4:
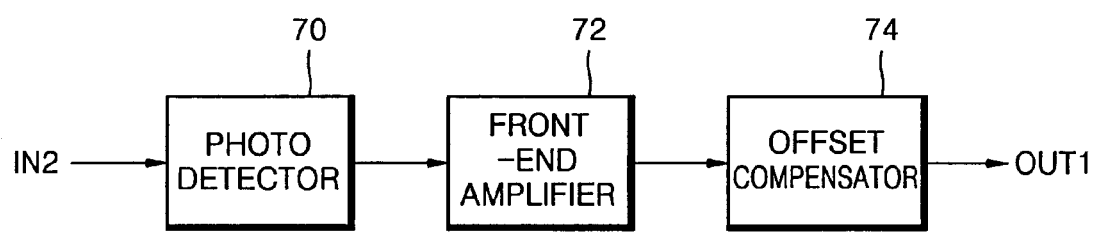
FIG. 4 illustrates a block diagram of a burst-mode receiving apparatus, according to the present invention, in which an input signal is generated.

FIG. 4 illustrates a block diagram of the burst-mode receiving apparatus for generating the input signal, according to an embodiment of the present invention, which includes a photo detector 70, a front-end amplifier 72, and an offset compensator 74.

The photo detector 70 dynamically detects light, which is input from an input terminal IN2, in the unit of a packet, converts the detected light into an electrical signal, and outputs the converted electrical signal to the front-end amplifier 72. Then, the front-end amplifier 72 amplifies the electrical signal generated by the photo detector 70 and outputs the amplified electrical signal to the offset compensator 74. At this time, the offset compensator 74 compensates for an offset of the signal amplified by the front-end amplifier 72 and outputs the result of the compensation as an input signal to the reset signal generator 12 of FIG. 1, via an output terminal OUT1.

The structure and operations of the reset signal generator 12 of FIG. 1, according to a preferred embodiment of the present invention will now be described with reference to FIG. 5, and FIGS. 6(a) through (c).

Figure 5:
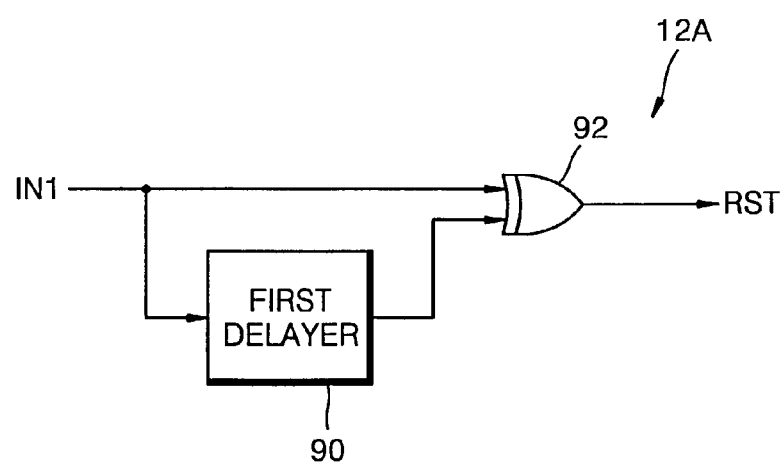
FIG. 5 is a circuit diagram of a reset signal generator of FIG. 1 according to a preferred embodiment of the present invention.

FIG. 5 is a circuit diagram of an embodiment 12A of the reset signal generator 12 of FIG. 1. The reset signal generator 12A includes a first delayer 90 and an exclusive OR operation unit 92.

The first delayer 90 delays an input signal input from an input terminal IN1 to correspond to the level of a voltage control signal Vc generated by the voltage control signal generator 10 and outputs the delayed signal to the exclusive OR operation unit 92. Then, the exclusive OR operation unit 92 performs an exclusive OR operation on the delayed signal input from the first delayer 90 and the input signal input from the input terminal IN1 and outputs the result of the exclusive OR operation as a reset signal RST to the clock signal generator 14 of FIG. 1.

On the assumption that a middle point T' of each bit included in the packet of an input signal is T/2, the operations of the reset signal generator 12A of FIG. 5 will now be described with reference to FIGS. 5 and 6(a) through (c). Here, T represents the length of each bit included in the packet of the input signal.

Figure 6:
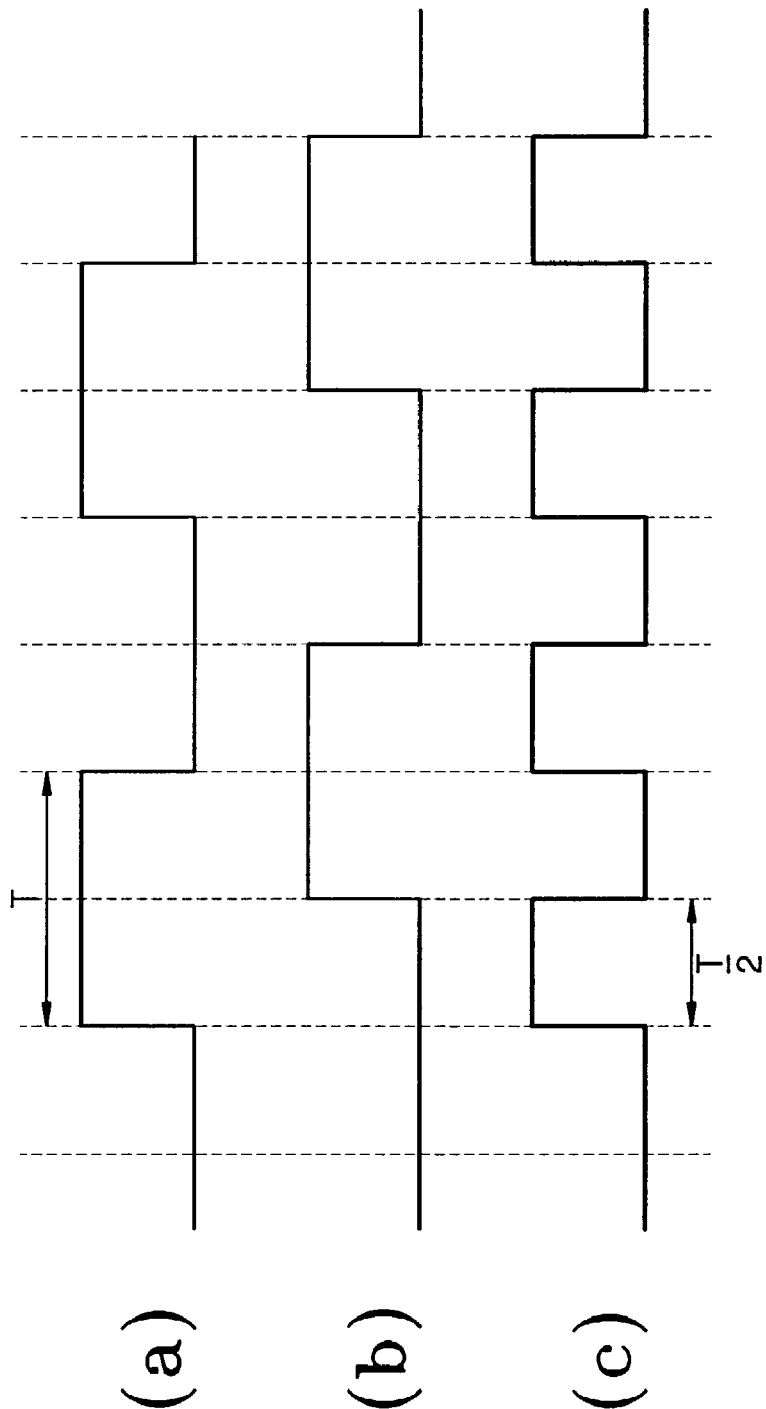
FIGS. 6(a) through (c) are waveform diagrams of each element included in the reset signal generator of FIG. 5.

FIGS. 6(a) through (c) are waveform diagrams of signals input to or output from the reset signal generator 12A of FIG. 5. In detail, FIGS. 6(a), (b) and (c) denote waveform diagrams of an input signal, a delayed input signal, and a reset signal RST, respectively.

In the reset signal generator 12A of FIG. 5, the first delayer 90 delays an input signal shown in FIG. 6(a), which is input via the input terminal IN1, by T/2 in response to the voltage control signal Vc generated by the voltage control signal generator 10 and then outputs the delayed signal shown in FIG. 6(b) to the exclusive OR operation unit 92. Then, the exclusive OR operation unit 92 performs the exclusive OR operation on the input signal, shown in FIG. 6(a), and the delayed signal, shown in FIG. 6(b), and outputs the reset signal RST, which is the result of the exclusive OR operation, as shown in FIG. 6(c).

Meanwhile, after step 32, in step 34, the clock signal generator 14 generates, as a recovered clock signal CLK', a signal having a level that changes at the middle point T' of each bit included in the packet of the input signal in response to the reset signal RST input from the reset signal generator 12 and the voltage control signal Vc input from the voltage control signal generator 10, and outputs the recovered clock signal CLK' to the output buffer 16 and the outside. The clock signal generator 14 generates the recovered clock signal CLK' having a rising edge or a falling edge at the falling edge of the reset signal RST.

Hereinafter, the structure and operations of the clock signal generator 14 of FIG. 1, according to a preferred embodiment of the present invention, will now be described with reference to the accompanying drawings.

Figure 7:
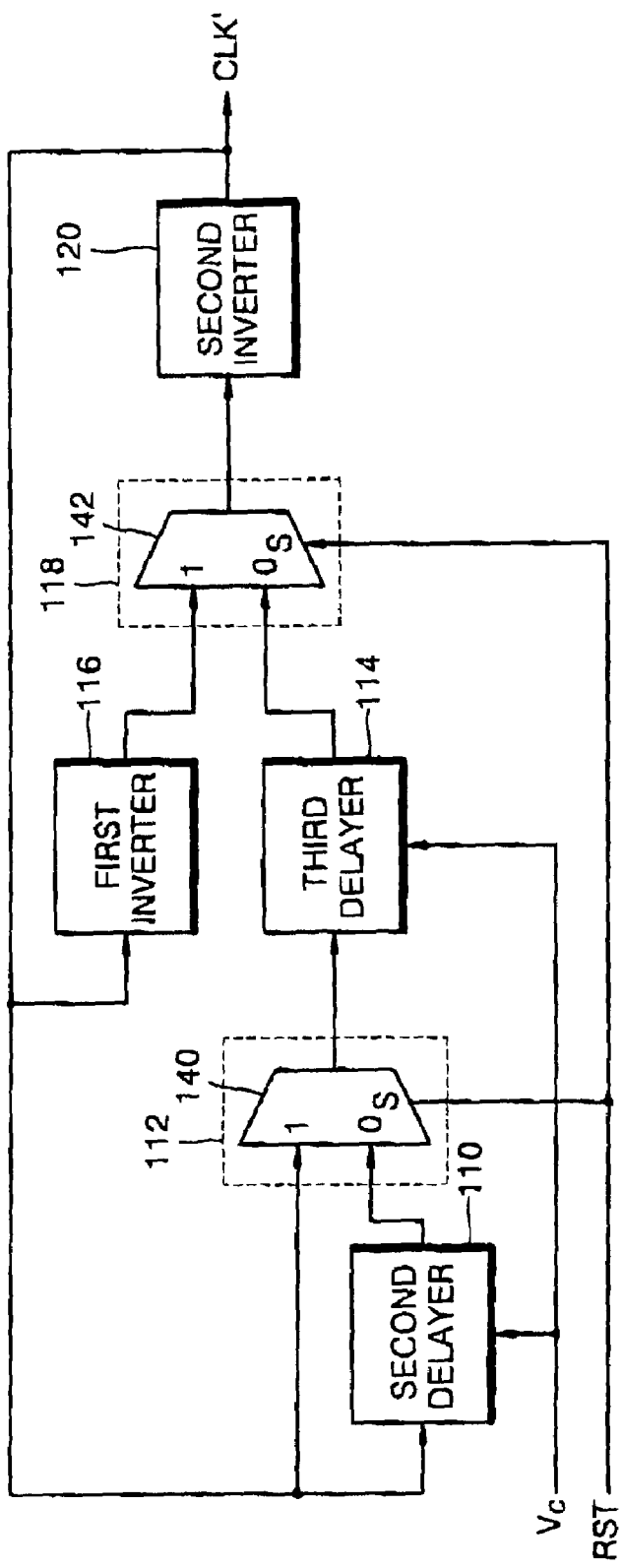
FIG. 7 illustrates a block diagram of a clock signal generator of FIG. 1 according to a preferred embodiment of the present invention.

FIG. 7 illustrates a block diagram of the clock signal generator 14 of FIG. 1, according to a preferred embodiment of the present invention. The clock signal generator 14 preferably includes second and third delayers 110 and 114, first and second selectors 112 and 118, and first and second inverters 116 and 120.

Figure 8:
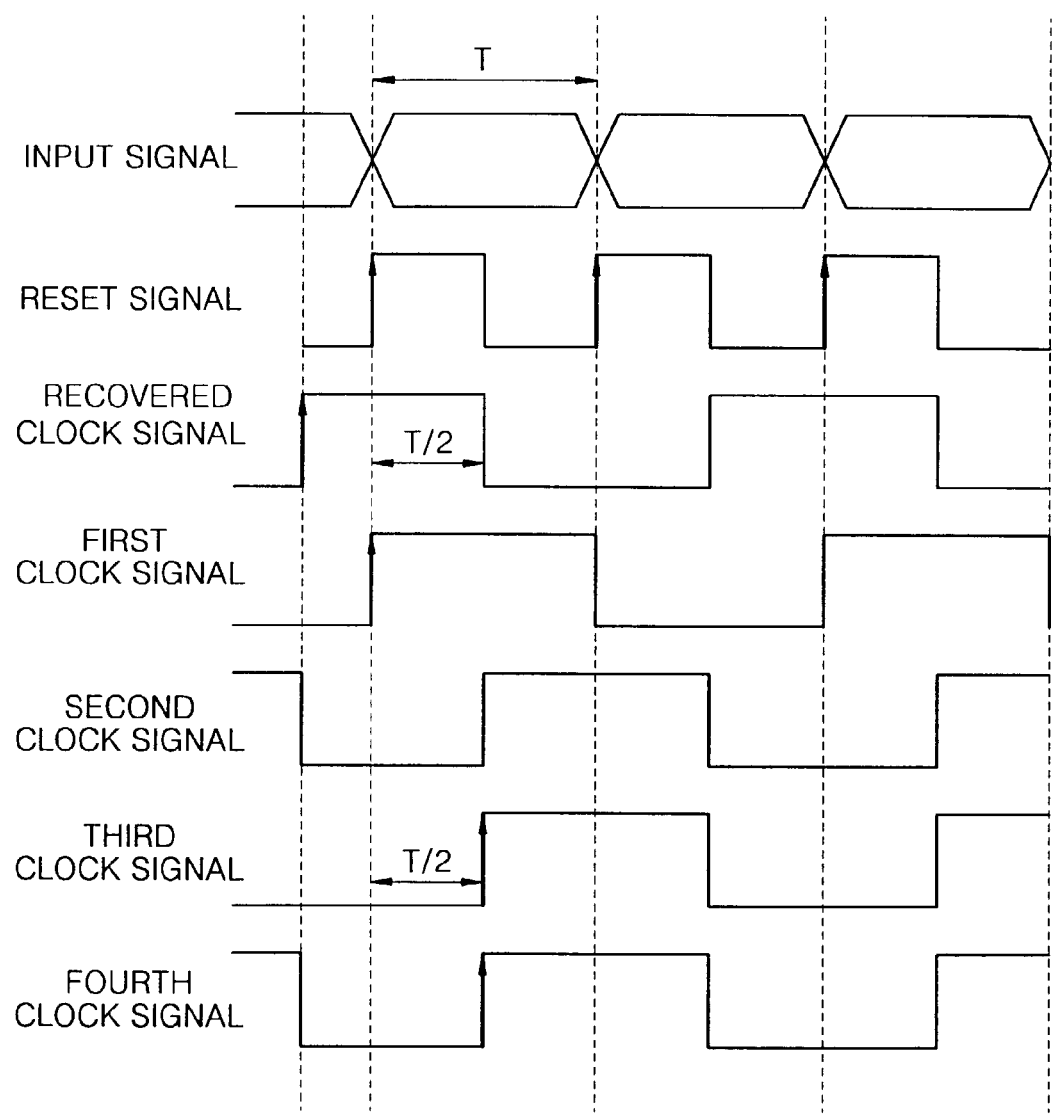
FIG. 8 is a waveform diagram for explaining the operations of each element of the clock signal generator of FIG.

FIG. 8 shows waveform diagrams of an input signal, a reset signal, a recovered clock signal, and first through fourth clock signals for explaining the operation of each element shown in FIG. 7, provided that the middle point T' of each bit included in the packet of the input signal is T/2. Referring to FIGS. 7 and 8, the second delayer 110 delays a recovered clock signal CLK' in response to a voltage control signal Vc output from the voltage control signal generator (10 of FIG. 1), and outputs the delayed clock signal to the first selector 112. Then, the first selector 112 selects either the signal delayed by the second delayer 110 or the recovered clock signal CLK' in response to the reset signal RST generated by the reset signal generator 12 and outputs the result of the selection as the first clock signal to the third delayer 114. More specifically, the first selector 112 may be a multiplexer 140 in which the signal delayed by the second delayer 110, the recovered clock signal CLK', and the reset signal RST generated by the reset signal generator (12 of FIG. 1) are input to a '0' input terminal, a '1' input terminal, and a selection terminal S, respectively. One of the signals input to the multiplexer 140 is selected in response to the reset signal RST and then is output as the first clock signal to the third delayer 114. Here, the multiplexer 140 selects the signal delayed by the second delayer 110 when the reset signal RST is at a 'low' logic value and selects the recovered clock signal CLK' when the reset signal RST is at a 'high' logic value.

At this time, the first inverter 116 inverts the recovered clock signal CLK' and outputs the inverted clock signal as the second clock signal, shown in FIG. 8, to the second selector 118. The third delayer 114 delays the first clock signal selected by the first selector 112, in response to the voltage control signal Vc generated by the voltage control signal generator (10 of FIG. 1). The first clock signal, which is delayed by the third delayer 114, is output to the second selector 118 as the third clock signal, shown in FIG. 8. The second selector 118 selects either the second clock signal, which is generated by the first inverter 116, or the third clock signal, which is generated by the third delayer 114, in response to the reset signal RST input from the reset signal generator (12 of FIG. 1), and inputs the selected signal as the fourth clock signal, shown in FIG. 8, to the second inverter 120. The second selector 118 may be a multiplexer 142. In the multiplexer 142, the third clock signal generated by the third delayer 114, the second clock signal generated by the first inverter 116, and the reset signal RST generated by the reset signal generator (12 of FIG. 1) are input to a '0' input terminal, '1' input terminal and selection terminal S of the multiplexer 142, respectively. Further, the second selector 118 selects one of the second and third clock signals in response to the reset signal RST and outputs the selected signal to the second inverter 120. Therefore, the multiplexer 142 selects the third clock signal generated by the third delayer 114 when the reset signal RST is at a "low" logic level and selects the second clock signal generated by the first inverter 116 when the reset signal RST is at a "high" logic level. For instance, the fourth clock signal is at a "low" logic level during T/2 after the reset signal RST changes from the "low" logic level to the "high" logic level, and the logic level of the fourth clock signal changes, i.e., from a "low" logic level to a "high" logic level, and is at the "high" logic level during T/2 when the reset signal RST changes from the "high" logic level to the "low" logic level.

The second inverter 120 inverts the signal selected by the second selector 118 and outputs the inverted signal as a recovered clock signal CLK' to the output buffer (16 of FIG. 1). Here, the second inverter 120 may be an inverter (not shown).

Also, each of the first delayer (90 of FIG. 5) and the second and third delayers (110 and 114 of FIG. 7) may be implemented by any even number of inverters (not shown). The time required to invert signals generated by each inverter is determined according to the voltage control signal Vc. For instance, the larger the level of the voltage control signal Vc, the greater an increase in the time required for delaying a signal generated by each of the first through third delayers 90, 110 and 114.

Here, the clock signal generator (14 of FIG. 7) can be used as the voltage control oscillator (56 of FIG. 3). In this case, unlike in FIG. 7, a signal having a "low" logic level instead of the reset signal RST shown in FIG. 8 is input to the first and second selectors 112 and 118.

After step 34, in step 36, the output buffer 16 buffers an input signal input through the input terminal IN1 and outputs the buffered signal as recovered data DATA in response to the recovered clock signal CLK' generated by the clock signal generator 14. Therefore, the output buffer 16 may be a D flip-flop 20 having a data input terminal D that inputs the input signal via the input terminal IN1, a clock terminal CK that inputs the recovered clock signal CLK', and a positive output terminal Q that outputs the recovered data DATA.

Hereinafter, a method for recovering the clock signal CLK', performed by a burst-mode receiving apparatus, according to an embodiment of the present invention, will be described with reference to the accompanying drawings for the case that an input signal input via the input terminal IN1 has a offset, on the assumption that the middle point T' of each bit included in the packet of an input signal is T/2.

FIGS. 9(a) through (d) are waveform diagrams of signals generated by each element of the reset signal generator (12A of FIG. 5) and a recovered clock signal CLK'. More specifically, FIG. 9(a) is the waveform diagram of an input signal, FIG. 9(b) is the waveform diagram of the input signal delayed by T/2, FIG. 9(c) is the waveform diagram of a reset signal RST, and FIG. 9(d) is the waveform diagram of a recovered clock signal CLK'.

In the case 200 where the input signal is input normally, i.e., without any offset, as shown in FIG. 9(a), the recovered clock signal CLK' having a rising edge at a falling edge of the reset signal RST, shown in FIG. 9(c), is generated in a method of recovering a clock signal according to the present invention. In this case, the recovered clock signal CLK' is aligned precisely with the middle point of the input signal, i.e., at T/2.

In the case 202 where an input signal is shifted to the left, which may be caused by a vibration, as shown at reference numeral 300 of FIG. 9(a), according to the present invention, the reset signal RST, shown in FIG. 9(c), is shifted to the left to an equal amount that the input signal of FIG. 9(a) is shifted to the left. Then, a recovered clock signal CLK', shown in FIG. 9(d), is generated from the shifted reset signal, shown in FIG. 9(c). Therefore, the recovered clock signal CLK', shown in FIG. 9(d), may be precisely aligned with the middle point T/2 of the input signal, shown in FIG. 9(a).

In the case 204 where an input signal is shifted to the right, which may be caused be a vibration, as shown at reference numeral 302 of FIG. 9(a), according to the present invention, a reset signal RST is shifted to the right in an equal amount that the input signal is shifted to the right. Then, a recovered clock signal CLK', shown in FIG. 9(d), is generated from the shifted reset signal, shown in FIG. 9(c). Therefore, the recovered clock signal CLK', shown in FIG. 9(d), may be precisely aligned at the middle point T/2 of the input signal, shown in FIG. 9(a).

In conclusion, in a burst-mode receiving apparatus and a method according to the present invention, a reset signal RST is generated dependent upon an input signal, a clock signal CLK' having a rising or falling edge at the middle point T' of each bit included in the packet of the input signal is recovered under the control of the generated reset signal RST, and data DATA can be recovered from the input signal using the recovered clock signal CLK'.

As described above, in a noise-resistive, burst-mode receiving apparatus and a method for recovering a clock signal and data in the burst-mode receiving apparatus, according to the present invention, the level of a recovered clock signal is changed at the middle point of each bit of an input signal. Therefore, the clock signal and data may be stably recovered even though the input signal has errors due to vibrations or other factors. Additionally, wherein an input signal is locked within 3 bits in a conventional multi-phase method, an input signal may be locked within 1 bit according to the present invention. Accordingly, it is possible to recover a clock signal and data quickly.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A noise-resistive, burst-mode receiving apparatus comprising:
   a voltage control signal generator for multiplying a frequency of a system clock signal and for generating a voltage control signal having a level that corresponds to the multiplied frequency of the system clock signal;
   a reset signal generator for delaying an input signal which is irregularly input in the unit of a packet, in response to the voltage control signal, for performing an exclusive OR operation on the delayed signal and the input signal, and for outputting the result of the exclusive OR operation as a reset signal;
   a clock signal generator for generating a current recovered clock signal in response to the reset signal, the voltage control signal and a recovered clock signal, for generating at least two clock signals, forming at least one of the at least two clock signals by delaying the recovered clock signal in accordance with the voltage control signal, for selecting between the at least two clock signals in accordance with the reset signal, and for outputting the current recovered clock signal; and
   an output buffer for buffering the input signal and for outputting the buffered signal as recovered data in response to the current recovered clock signal.

2. The noise-resistive, burst-mode receiving apparatus as claimed in claim 1, further comprising:
   a photo detector for dynamically detecting light in the unit of a packet, for converting the detected light into an electrical signal, and for outputting the converted electrical signal;
   a front-end amplifier for amplifying the electrical signal output from the photo detector and for outputting the amplified electrical signal; and
   an offset compensator for compensating for an offset of the amplified electrical signal and for outputting the result of the compensation for the offset as the input signal.

3. The noise-resistive, burst-mode receiving apparatus as claimed in claim 1, wherein the voltage control signal generator comprises:
   a phase-difference detector for detecting a phase difference between the system clock signal and a dividing signal and for outputting the detected phase difference;
   a charge pump for supplying or sinking an electric charge corresponding to the phase difference detected by the phase-difference detector;
   a loop filter for low-pass filtering voltage corresponding to the supplied or sunk electric charge and for outputting the result of the low pass filtering as the voltage control signal;
   a voltage control oscillator for outputting an oscillating signal having a frequency that is oscillated in response to the voltage control signal; and
   a divider for dividing the oscillating signal and for outputting the result of the division as the dividing signal to the phase-difference detector.

4. The noise-resistive, burst-mode receiving apparatus as claimed in claim 1, wherein the reset signal generator comprises:

a first delayer for delaying the input signal corresponding to the level of the voltage control signal and for outputting the delayed input signal; and an exclusive OR operation unit for performing an exclusive OR operation on the input signal delayed by the first delayer and the input signal, and for outputting the result of the exclusive OR operation as a reset signal.

5. The noise-resistive, burst-mode receiving apparatus as claimed in claim 1, wherein the clock signal generator comprises:

a second delayer for delaying the recovered clock signal in response to the voltage control signal and for outputting the delayed clock signal;

a first selector for selectively outputting one of the signal delayed by the second delayer and the recovered clock signal in response to the reset signal;

a third delayer for delaying the signal selected by the first selector in response to the voltage control signal and for outputting the delayed signal;

a first inverter for inverting the recovered clock signal and for outputting the inverted signal;

a second selector for selectively outputting one of the signal inverted by the first inverter and the signal delayed by the third delayer in response to the reset signal; and a second inverter for inverting the signal selected by the second selector and for outputting the inverted signal as the current recovered clock signal.

6. The noise-resistive, burst-mode receiving apparatus as claimed in claim 5, wherein the first selector is a multiplexer, and wherein the signal delayed by the second delayer, the recovered clock signal, and the reset signal generated by the reset signal generator are input to a '0' input terminal, a '1' input terminal, and a selection terminal S, respectively.

7. The noise-resistive, burst-mode receiving apparatus as claimed in claim 5, wherein the second selector is a multiplexer, and wherein the signal generated by the third delayer, the signal generated by the first inverter, and the reset signal generated by the reset signal generator are input to a '0' input terminal, '1' input terminal and selection terminal S, respectively.

8. The noise-resistive, burst-mode receiving apparatus as claimed in claim 5, wherein one or more of the first delayer, the second delayer, and the third delayer is any even number of inverters.

9. The noise-resistive, burst-mode receiving apparatus as claimed in claim 5, wherein the voltage control oscillator comprises the second delayer, the first selector, the third delayer, the first inverter, the second selector, and the second inverter, wherein the reset signal is maintained at a predetermined logic level so that the first selector selects the signal delayed by the second delayer and the second selector selects the signal delayed by the third delayer.

10. The noise-resistive, burst-mode receiving apparatus as claimed in claim 5, wherein the voltage control oscillator comprises the second delayer, the first selector, the third delayer, the first inverter, the second selector, and the second inverter, wherein the reset signal is maintained at a predetermined logic level so that the first selector selects the recovered clock signal and the second selector selects the signal generated by the first inverter.

11. The noise-resistive, burst-mode receiving apparatus as claimed in claim 1, wherein the output buffer comprises a D flip-flop having a data input terminal through which the input signal is input, a clock terminal through which the recovered clock signal is input, and a positive output terminal through which the recovered data is output.

12. The noise-resistive, burst-mode receiving apparatus as claimed in claim 1, wherein the reset signal generator delays the input signal by T/2 in response to the voltage control signal, and the clock signal generator raises the recovered clock signal at a falling edge of the reset signal.

13. A method for recovering a clock signal and data, performed by a noise-resistive, burst-mode receiving apparatus, the method comprising:

multiplying a frequency of a system clock signal and then generating a voltage control signal having a level that corresponds to the multiplied frequency;

delaying an input signal, which is irregularly given in the unit of a packet, using the voltage control signal, and then performing an exclusive OR operation on the delayed signal and the input signal to obtain a reset signal;

generating a current recovered clock signal, using the reset signal, the voltage control signal and a recovered clock signal, by generating at least two clock signals, forming at least one of the at least two clock signals by delaying the recovered clock signal in accordance with the voltage control signal, and selecting between the at least two clock signals in accordance with the reset signal; and buffering the input signal and obtaining data recovered from the buffered signal, using the current recovered clock signal.

14. The method as claimed in claim 13, wherein generating the current recovered clock signal further comprises inverting a selected clock signal.

15. The method as claimed in claim 13, wherein generating the at least two clock signals comprises:

delaying the recovered clock signal by a first delay in response to the voltage control signal and outputting a first delayed clock signal;

selectively outputting one of the first delayed clock signal and the recovered clock signal in response to the reset signal and outputting a first selected clock signal;

delaying the first selected clock signal by a second delay in response to the voltage control signal and outputting a second delayed clock signal.

16. The method as claimed in claim 15, wherein generating the at least two clock signals further comprises:

inverting the recovered clock signal and outputting an inverted clock signal;

selectively outputting one of the inverted clock signal and the second delayed clock signal in response to the reset signal and outputting a second selected clock signal.

17. The method as claimed in claim 16, further comprising inverting the second selected clock signal and outputting the inverted signal as the current recovered clock signal.

18. The method as claimed in claim 17, further comprising maintaining the reset signal at a predetermined logic level so that the first selected clock signal is the first delayed clock signal and the second selected clock signal is the second delayed clock signal.

19. The method as claimed in claim 17, further comprising maintaining the reset signal at a predetermined logic level so that the first selected clock signal is the recovered clock signal and the second selected clock signal is the first inverted clock signal.

20. The method as claimed in claim 13, wherein delaying the input signal includes delaying the input signal by T/2 in response to the voltage control signal, and generating the current recovered clock signal occurs at a falling edge of the reset signal.

* * * * *